United States Patent [19]

Boon et al.

[11] Patent Number: 5,353,566

[45] Date of Patent: Oct. 11, 1994

[54] MOUNTING MEMBER TO ELIMINATE VIBRATION AND ELECTROSTATIC DISCHARGES

[75] Inventors: Anthony J. Boon, Kitchener; Scott A. Wishart, Waterloo, both of Canada

[73] Assignee: NCR Corporation, Dayton, Ohio

[21] Appl. No.: 69,881

[22] Filed: Jun. 1, 1993

[51] Int. Cl.⁵ .............................................. E04B 9/00
[52] U.S. Cl. ....................................... 52/474; 52/271; 312/111
[58] Field of Search .................. 57/474, 270, 271, 261; 312/111, 263

[56] References Cited

U.S. PATENT DOCUMENTS 4,326,760  4/1982  Ziegelheim ...................... 312/111 X
5,076,723 12/1991  Berger ............................ 312/263 X Primary Examiner—Carl D. Friedman
Assistant Examiner—Creighton Smith
Attorney, Agent, or Firm—Elmer Wargo

[57] ABSTRACT

A mounting member or connecting device is used to connect a first member to a second member. The connecting device includes a male member and a female member which are coupled together through an opening in the first member. The first member may be a divider panel and the second member may be a cover panel, for example, with the second member having first and second parallel fingers thereon. A tolerance ring, formed in the shape of a band which is less than a complete circle. is mounted on a cylindrical section of the male and female members. The tolerance ring has corrugations thereon which are crushed to some degree when the first and second fingers are pushed on to the associated cylindrical section with the tolerance ring thereon. This connection provides a vibration free connection and also eliminates ESD problems between the connected members.

12 Claims, 3 Drawing Sheets

MOUNTING MEMBER TO ELIMINATE VIBRATION AND ELECTROSTATIC DISCHARGES

BACKGROUND OF THE INVENTION

Field of Invention

This invention relates to a mounting member or connecting device for connecting one panel to another with a connection that eliminates vibration and electrostatic charges between the two panels.

Background Information

Panels or covers are used in business machines, for example, to permit access to electronic equipment and circuits which are located in the interior of the machines. Some of the panels or covers may be made of plastic or metal and tend to rattle or cause unwanted noise. Sometimes, the connections between the various panels do not provide a reliable ground path to eliminate Electro Static Discharge (ESD) or provide adequate grounding.

SUMMARY OF THE INVENTION

An object of this invention is to obviate the problems mentioned in the Background Information.

Another object of this invention is to provide a low cost connection device for conducting electrostatic discharges from one metal panel to another metal panel, for example.

A feature of this invention is that it enables a plurality of panels to be installed in a side by side relationship without an accumulation error developing between the extremities of a business machine in which this invention is used.

The connection device made according to this invention is easy to install.

Another feature of this invention is that it eliminates costly grounding straps. It also eliminates lock washers which mar painted surfaces, with the washers generally getting lost after the panels are removed for maintenance of the associated machine.

In a first aspect of this invention, there is provided a connecting device for connecting a first panel to a second panel, said first panel having first and second substantially parallel fingers extending therefrom, said connecting device comprising:

a male member secured to said second panel and having a cylindrical section upstanding from said second panel and a head on the free end of said cylindrical section; and a tolerance ring made from a strip of stainless steel which is formed into a band which is less than a complete circle, said tolerance ring positioned on said cylindrical section;

said tolerance ring having corrugations thereon which are aligned with a longitudinal axis of said cylindrical section; and said cylindrical section with said tolerance ring thereon forming an interference fit with said first and second parallel fingers.

In another aspect of this invention, there is provided a connecting device for connecting first and second panels to a third panel;

said first and second panels each having associated first and second parallel fingers extending therefrom; and said third panel having an opening therein;
said connecting device comprising:

a male member having a head and first and second concentric cylindrical sections having an associated longitudinal axis, with said first cylindrical section positioned between said head and said second cylindrical section;

a female member having a head and a cylindrical section, said female member having hole passing through said head and cylindrical section;

said second cylindrical section passing through said opening in said third panel and through said hole in said female member to retain said male and female members on opposed sides of said third panel;

a first tolerance ring having corrugations on the exterior thereof, with said first tolerance ring positioned on said first cylindrical section of said male member;

a second tolerance ring having corrugations on the exterior thereof, with said second tolerance ring positioned on said cylindrical section of said female member; and said corrugations on said first and second tolerance rings aligned with said longitudinal axis;

said first cylindrical section with said first tolerance ring thereon forming an interference fit with respect to the associated first and second parallel fingers on said second panel; and said cylindrical section of said female member with said second tolerance ring thereon forming an interference fit with respect to the associated first and second parallel fingers on said first panel.

The above advantages, and others, will be more readily understood in connection with the following specification, claims, and drawing.

BRIEF DESCRIPTION OF THE DRAWING

FIG. 6 is shown on the sheet containing FIG. 1.

DETAILED DESCRIPTION OF THE PREFERRED EMBODIMENT

Figure 1:
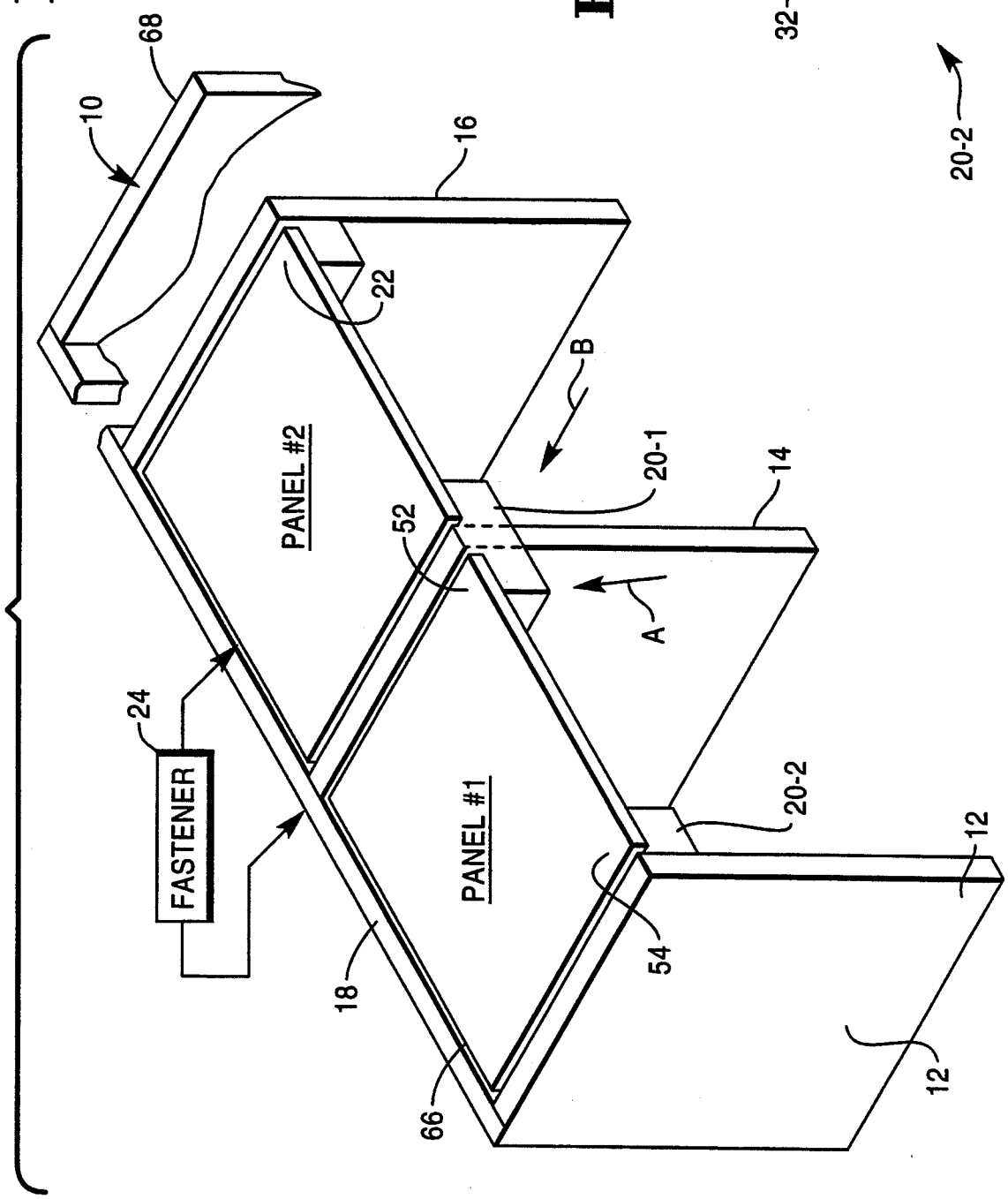
FIG. 1 is a schematic diagram showing how connecting devices made according to this invention may be used for connecting panels #1 and #2, for example, to divider panels and a side panel in a business machine, for example.

FIG. 1 is a general schematic view, in isometric form, of a business machine 10, for example, in which connecting devices made according to this invention may be used. The machine 10, shown only partially, may have a plurality of members or panels, like panel #1 and panel #2 which are mounted between a member or side panel 12, additional members or divider panels 14 and 16, and back panel 18 as shown. The side and divider panels, like 12 and 14 and 16 are connected directly to an electrical ground, and these panel are coated with a conductive coating to prevent rusting. The panels #1 and #2 are removable to provide access to the interior of the machine 10 when maintenance and repair are required. These panels #1 and #2 are also used to protect the interior of the machine, and they are also used to provide a reliable path to ground to eliminate the ESD problems alluded to earlier herein.

The connecting devices alluded to with regard to FIG. 1 come in two forms, namely, first connecting device 20-1 and second connecting device 20-2. The first connecting device 20-1 is used to secure one end of a panel, like panel #2 to the divider panel 14, and it is also used to secure panel #1 to the same divider panel 14. The remaining side 22 of the panel #2 is secured to the divider panel 16 by another connecting device 20-1 (not shown in FIG. 1). The remaining side of panel #1 is secured to the side panel 12 by the connecting device 20-2. The backsides of the panels #1 and #2 are secured to the back panel 18 by conventional fasteners, shown only schematically as fastener 24.

Figure 2:
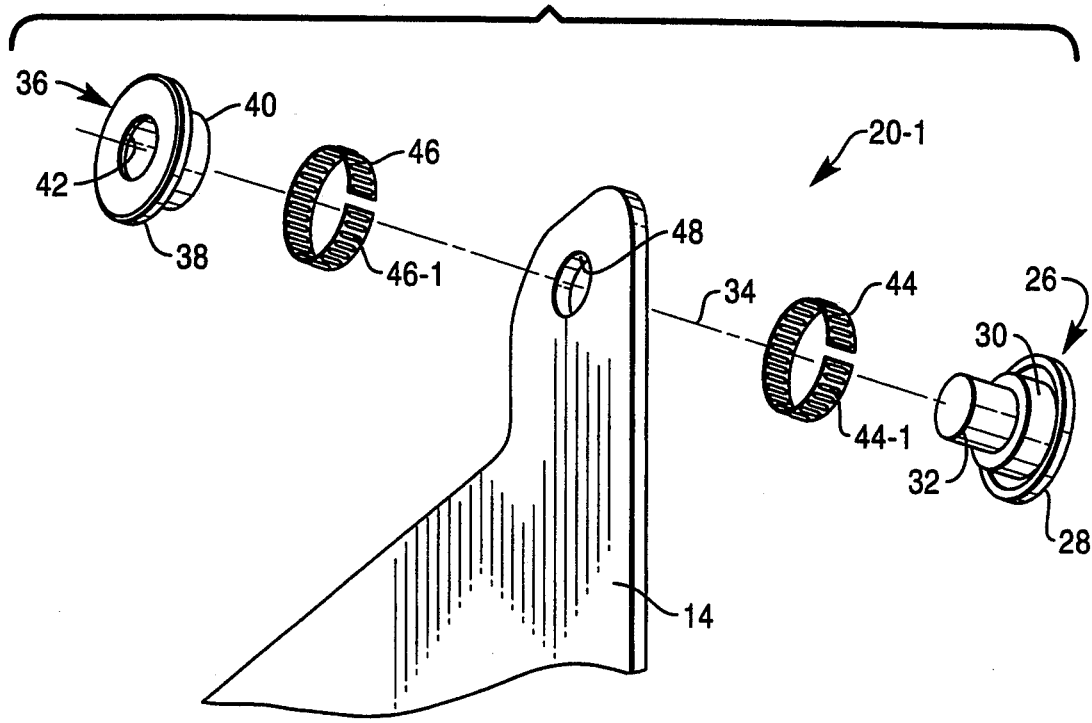
FIG. 2 is a general exploded view of the connecting device shown schematically in FIG. 1 which is used to connect panels #1 and #2 to a divider panel included in the business machine; this view is taken from the general direction of arrow A shown in FIG. 1.

FIG. 2 is an exploded view of the connecting device 20-1 shown only schematically in FIG. 1, with this connecting device being used to connect panels #1 and #2 to the divider panel 14. The connecting device 20-1 includes a male member 26 having a head portion 28, a first cylindrical portion or section 30, and a second cylindrical portion or section 32 which are concentrically located relative to a longitudinal axis 34 of the connecting device 20-1.

The connecting device 20-1 also includes a female member 36 having a head portion 38, a cylindrical section 40 (having the same diameter as the cylindrical section 30), and a hole 42 which are concentrically located relative to the longitudinal axis 34. The hole 42 passes through the entire female member 36, and it is dimensioned to provide an interference fit with the second cylindrical portion 32 of the male member 26 when these two members are assembled as will be described hereinafter.

Figure 4:
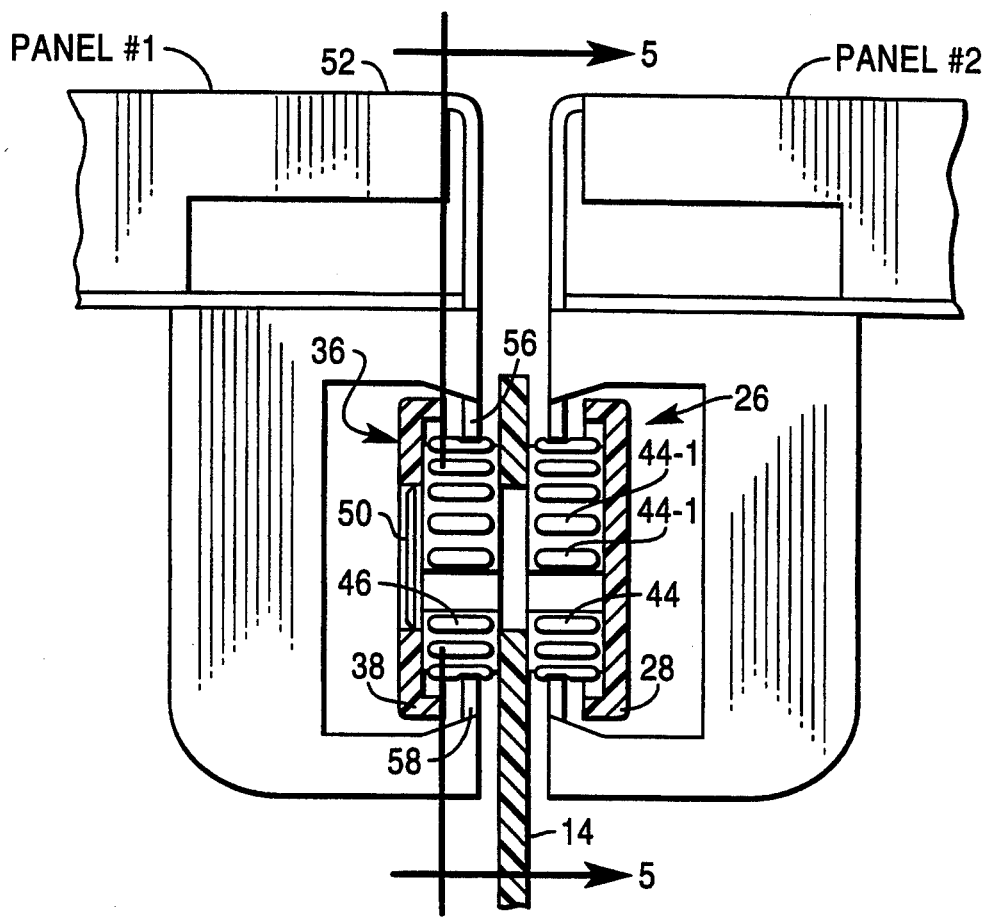
FIG. 4 is a partly sectional view, taken from the general direction of arrow B shown in FIG. 1, and the view is used to show additional details of the connecting device.

The connecting device 20-1 also includes tolerance rings 44 and 46, as shown in FIGS. 2 and 4. Each of the tolerance rings 44 and 46 is made from a strip of stainless steel and is formed into a circular band which is less than a complete circle. Each of these tolerance rings 44 and 46 has a plurality of corrugations 44-1 (best seen in FIG. 4) extending along the longitudinal axis (like 34 in FIG. 2) of the assembled connecting device 20-1. Some of these corrugations 44-1 become deformed during the process of connecting the panels #1 and #2 to connecting device 20-1 as will be described hereinafter.

The assembly of the connecting device 20-1 the divider panel 14 is as follows. The tolerance ring 44 is mounted on the first cylindrical section 30 of the male member 26, and the tolerance ring 46 is mounted on the cylindrical section 40 of the female member 36. When so positioned, the second cylindrical section 32 of the male member is inserted through an opening 48 in the divider panel 14 (FIG. 2) and inserted into the opening of the female member 36, with an interference fit established therebetween. The interference fit mentioned is used to secure the connecting device 20-1 to the divider panel 14. The first cylindrical section 30 of the male member 26 and the cylindrical section 40 of the female member 40, in effect, also form abutments to enable both these male and female members to abut against opposed sides of the divider panel 14. If necessary or desirable, the end 50 of the second cylindrical section 32 may be peened over after the male and female members 26 and 36 are installed as shown in FIG. 4 to further secure these members together. The width of the tolerance rings 44 and 46, as measured along the longitudinal axis 34, is small enough to enable them to be positioned on the connecting device 20-1 when it is assembled as shown in FIG. 4.

Figure 3:
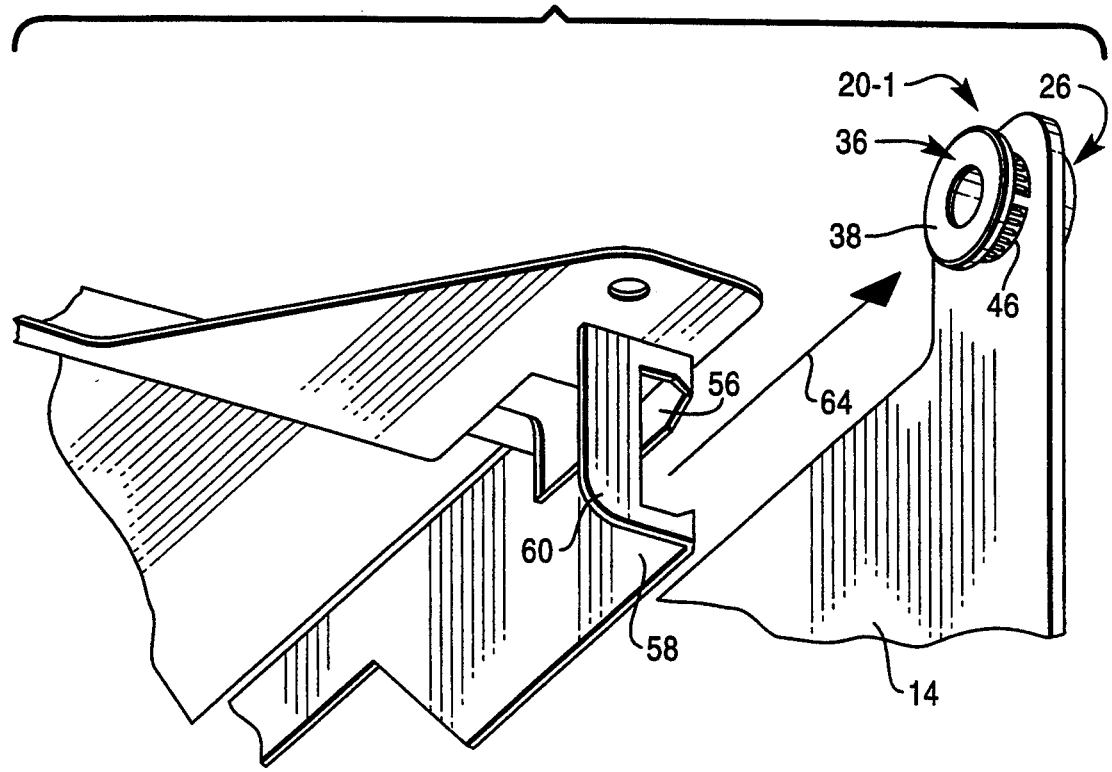
FIG. 3 is a view which is taken from the same general direction as that shown in FIG. 2 and is used to show how parallel fingers associated with panel #1 are connected to the connecting device.
Figure 5:
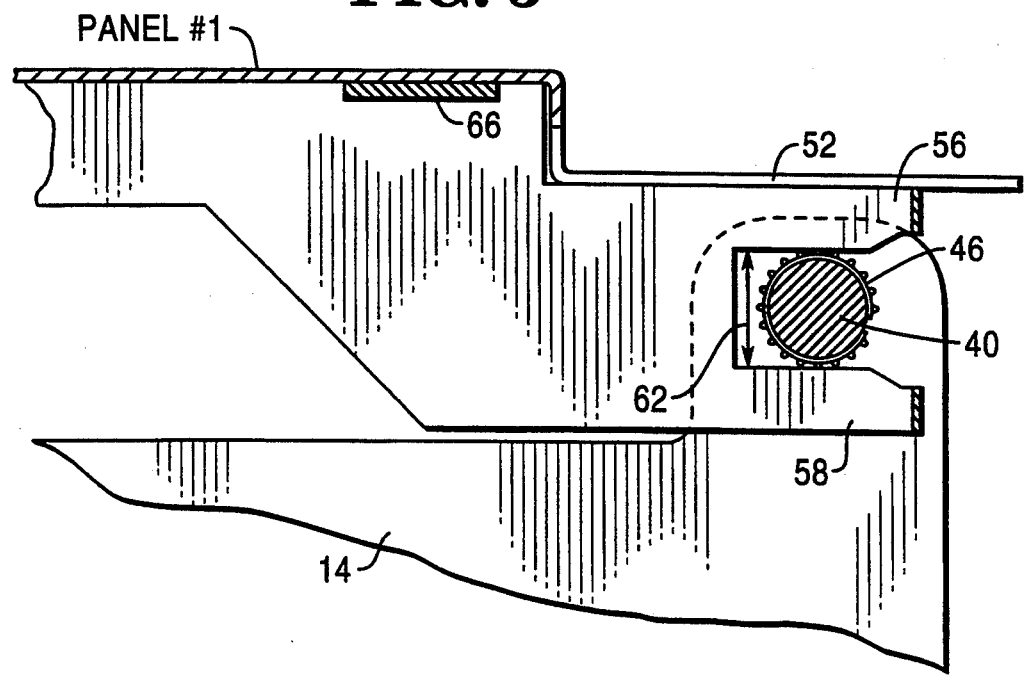
FIG. 5 is a cross sectional view, taken along the line 5—5 of FIG. 4 to show how parallel fingers on panel #1 connect with the connecting device 20-1.

The cover panel #1 is connected to the connecting devices 20-1 and 20-2 in the following manner. One end 52 (FIG. 1) of panel #1 is connected to the connecting device 20-1, and the remaining end 54 is connected to the connecting device 20-2. The end 52 of the panel #1 has spaced apart parallel fingers 56 and 58 as shown best in FIG. 5. These two fingers 56 and 58 are supported by a joining strip 60, shown best in FIG. 3, to keep the fingers from spreading apart when they are force fitted on the connecting device 20-1. The distance between the fingers 56 and 58, as measured in the direction of double arrow 62 of FIG. 5, is such as to form an interference fit with the associated tolerance ring 46 and cylindrical section; in this instance, it is cylindrical section 40 of the female member 36. When connecting the panel #1 to the connecting device 20-1, the end 52 of the panel #1 is moved in the direction of arrow 64 (FIG. 3) to cause the fingers 56 and 58 to form the interference fit previously mentioned. During this process, those corrugations 46-1 coming into contact with the fingers 56 and 58 are crushed to form a tight fit therebetween. This tight fit eliminates vibration between the panel #1 and the divider panel 14 and also provides a good ground therebetween. The end 54 of the panel #1 has first and second fingers (not shown but similar to fingers 56 and 58) which interconnect with the connecting device 20-2 as just described. After the ends 52 and 54 of panel #1 are secured to the connecting devices 20-1 and 20-2, respectively, the back end 66 (FIG. 1) of panel #1 is secured to the back panel 18 by a conventional fastener 24 which is not important to an understanding of this invention.

Figure 6:
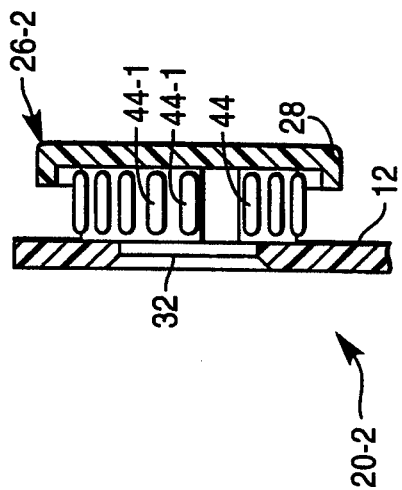
FIG. 6 is a view, similar to FIG. 4 showing a modified male member of a connecting device which is used with the side panel shown in FIG. 1.

FIG. 6 shows a male member 26-2 which is a modified version of the male member 26 shown in FIG. 2. The male member 26-2 is used in the connecting device 20-2 which is used to connect the end 54 of panel #1 to the side panel 12. The male member 26-2 in FIG. 6, which is associated with the connecting device 20-2, may have a shorter length on the second cylindrical section 32-2 to present a flush appearance on the exterior of the machine 10. The second cylindrical section 32-2 is peened over on the exterior of the side panel 12 to help secure the male member 26-2 to the side panel 12.

In some situations, the panels #1 and #2 may be made of metal. In other situations, these panels may be made of plastic or a non-conducting material. When the panels #1 and #2 are made of plastic material, a layer 66 (FIG. 5) of electrically conducting material is placed thereover to provide the ESD shielding or grounding mentioned. In some situations, even though the panels #1 and #2 and the divider panels are made of metal, an electrically conducting layer of material, like 66, enhances the ESD ground path. When the corrugations 44-1 and 46-1 in the tolerance rings 44 and 46, respectively, are crushed due to the action of the fingers 56 and 58, for example, a tight grip is effected which eliminates vibration between the connected parts and enables the grounding mentioned.

Another feature of the connecting devices 20-1 and 20-2 is that they present a neat appearance, and they also enable a plurality of panels, like #1 and #2 to be connected to the machine 10 in side by side relationship, as shown in FIG. 1, without any cumulative error occurring due varying tolerances of the connecting devices. Under some prior art techniques, if there are six panels, like panel #1 for example, in side by side relationship, the last panel in such an arrangement might extend outside the side panel 68 (FIG. 1) which is opposed to the side panel 12.

The tolerance rings like 44 and 46 are conventional; however, they are generally used in prior art connections by being wrapped around the outer race of a ball bearing, for example, with the bearing and the ring being inserted in a receiving hole to take up some looseness between the hole and the outer race of the bearing.

What is claimed is:

1. A connecting device for connecting a first panel to a second panel, said first panel having first and second substantially parallel fingers extending therefrom, said connecting device comprising:
   a male member having a head and a cylindrical section having an associated longitudinal axis, with said male member secured to said second panel and with said cylindrical section upstanding from said second panel; and
   a tolerance ring made from a strip of stainless steel which is formed into a band which is less than a complete circle, said tolerance ring positioned on said cylindrical section;
   said tolerance ring having corrugations thereon which are aligned with said longitudinal axis of said cylindrical section; and
   said cylindrical section with said tolerance ring thereon forming an interference fit with said first and second parallel fingers.

2. The connecting device as claimed in claim 1 in which said first panel is made of non-conducting material and has a layer of conducting material thereover, and said second panel is made of electrically conducting material.

3. A combination comprising:
   a first member having an opening therein;
   a second member having first and second parallel fingers extending therefrom; and
   a connecting device for connecting said second member and said first member together;
   said connecting device comprising:
   a male member having first and second concentric cylindrical sections thereon relative to an associated longitudinal axis;
   a female member having a hole therein; and
   a tolerance ring having an exterior, with corrugations on the exterior thereof, with said tolerance ring positioned on said first cylindrical section, and with said corrugations aligned with said longitudinal axis;
   said second cylindrical section passing through said opening in said first member and being retained in said hole in said female member; and
   said first cylindrical section with said tolerance ring thereon forming an interference fit with respect to said first and second parallel fingers.

4. The combination as claimed in claim 3 in which said first and second members are made of electrically conducting material having a layer of conducting material thereon.

5. The combination as claimed in claim 4 in which said male member has a head portion and said tolerance ring has first and second sides, with said first side of said tolerance ring abutting against said head portion and said second side of said tolerance abutting against one side of said first member.

6. The combination as claimed in claim 5 in which said tolerance ring is made of a strip of stainless steel which is formed into less than a complete circle.

7. The combination as claimed in claim 6 in which said female member has a cylindrical section thereon with said hole passing through said cylindrical section, and said combination also comprises:
   a third member having first and second parallel fingers extending therefrom, with said second member positioned on said one side of said first member and said third member positioned on a remaining side of said first member; and
   a tolerance ring positioned on said cylindrical section of said female member, with said tolerance ring on said female member having first and second sides, and with said last named first side positioned next to said head of said female member and with said last named second side positioned next to said remaining side of said first member;
   said cylindrical section of said female member with the associated said tolerance ring thereon forming an interference fit with respect to the associated first and second parallel fingers of said third member.

8. The combination as claimed in claim 7 in which said tolerance ring on said female men, her is made of a strip of stainless steel which is formed into less than a complete circle.

9. A connecting device for connecting first and second panels to a third panel;
   said first and second panels each having associated first and second parallel fingers extending therefrom; and
   said third panel having an opening therein;
   said connecting device comprising:
   a male member having a head and first and second concentric cylindrical sections having an associated longitudinal axis, with said first cylindrical section positioned between said head and said second cylindrical section;
   a female member having a head and a cylindrical section, said female member having hole passing through said head and cylindrical section;
   said second cylindrical section passing through said opening in said third panel and through said hole in said female member to retain said male and female members on opposed sides of said third panel;
   a first tolerance ring having corrugations on the exterior thereof, with said first tolerance ring positioned on said first cylindrical section of said male member;
   a second tolerance ring having corrugations on the exterior thereof, with said second tolerance ring positioned on said cylindrical section of said female member; and
   said corrugations on said first and second tolerance rings aligned with said longitudinal axis;

said first cylindrical section with said first tolerance ring thereon forming an interference fit with respect to the associated first and second parallel fingers on said second panel; and said cylindrical section of said female member with said second tolerance ring thereon forming an interference fit with respect to the associated first and second parallel fingers on said first panel.

10. The connecting device as claimed in claim 9 in which each of said first and second tolerance rings is made of a strip of stainless steel which is formed into less than a complete circle.

11. The connecting device as claimed in claim 10 in which said first and second panels are made on non-electrically conducting material having a coating of electrically conducting material thereover, and said third panel is made of electrically conducting material.

12. The connecting device as claimed in claim 10 in which said first, second, and third panels are made electrically conducting material having a coating of electrically conducting material thereover to prevent rusting.

* * * * *

UNITED STATES PATENT AND TRADEMARK OFFICE
CERTIFICATE OF CORRECTION

PATENT NO. :  5,353,566
DATED      :  October 11, 1994
INVENTOR(S):  Anthony J. Boon et al.

It is certified that error appears in the above-indentified patent and that said Letters Patent is hereby corrected as shown below:

Column 6, line 36, "men, her" should be --member--.

Signed and Sealed this

Second Day of May, 1995

Attest:

BRUCE LEHMAN

Attesting Officer

Commissioner of Patents and Trademarks